United States Patent [19]

Denham

[11] Patent Number: 5,227,657
[45] Date of Patent: Jul. 13, 1993

[54] BASE-EMITTER REVERSE BIAS PROTECTION FOR BICMOS IC

[75] Inventor: Martin S. Denham, Newberg, Oreg.

[73] Assignee: Intel Corporation, Santa Clara, Calif.

[21] Appl. No.: 811,827

[22] Filed: Dec. 20, 1991

[51] Int. Cl.⁵ .......................................... H01L 29/72
[52] U.S. Cl. ................... 257/491; 257/567; 257/370; 361/101; 361/56
[58] Field of Search ............... 361/101, 56; 257/328, 257/356, 357, 362, 567, 487, 491, 370

[56] References Cited

U.S. PATENT DOCUMENTS 3,601,625  8/1971  Redwine et al. ............... 257/356
4,374,364  2/1983  Hemery et al. ................ 257/567
4,672,416  6/1987  Nakazato et al. ............. 257/370

OTHER PUBLICATIONS

*Hot-Carrier Reliability of Bipolar Transistors,* by David Burnett and Chenmig Hu. 28th Annual Proceedings Reliability Physics 1990, IEEE Catalog No. 90CH2787-0, pp. 164–169.

*Bipolar Transistor Design for Low-Process Temperature 0.5 microprocessor BI-CMOS,* by M. Norishima, Y. Niitsu, G. Sasaki, H. Iwai and K. Maeguchi, Semiconductor Device Engineering Laboratory, 9.5.1–9.5.4.

Primary Examiner—Jerome Jackson
Attorney, Agent, or Firm—Blakely, Sokoloff, Taylor, Zafman

[57] ABSTRACT

Emitter-base protection for a first bipolar transistor formed as part of a BiCMOS circuit. A second bipolar transistor is formed in the same well as the first bipolar transistor with both transistors using the well as their collectors. A current path through the collector-emitter of the second transistor provides current to the base of the first transistor maintaining the emitter-to-base voltage of the first transistor at a relatively low reverse potential.

9 Claims, 3 Drawing Sheets

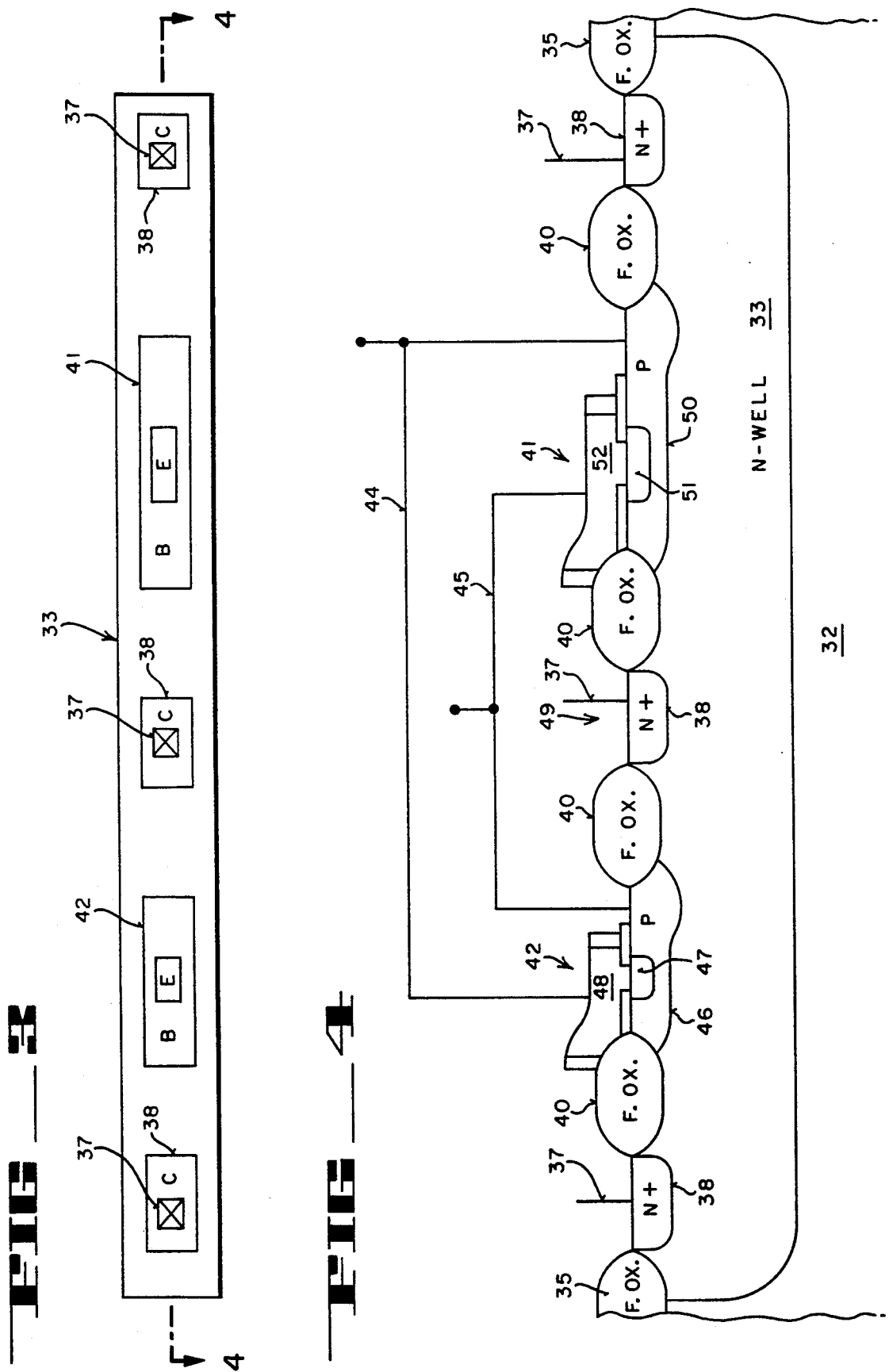

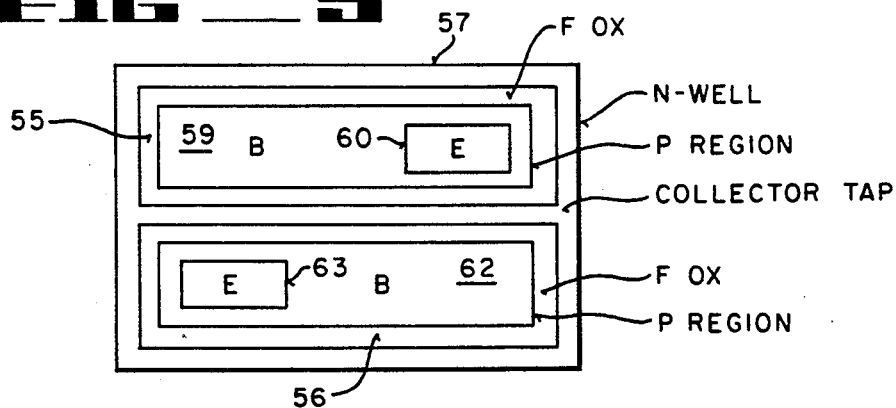
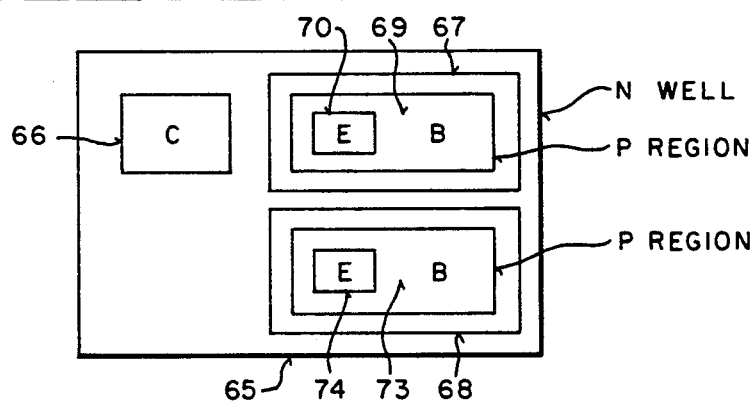
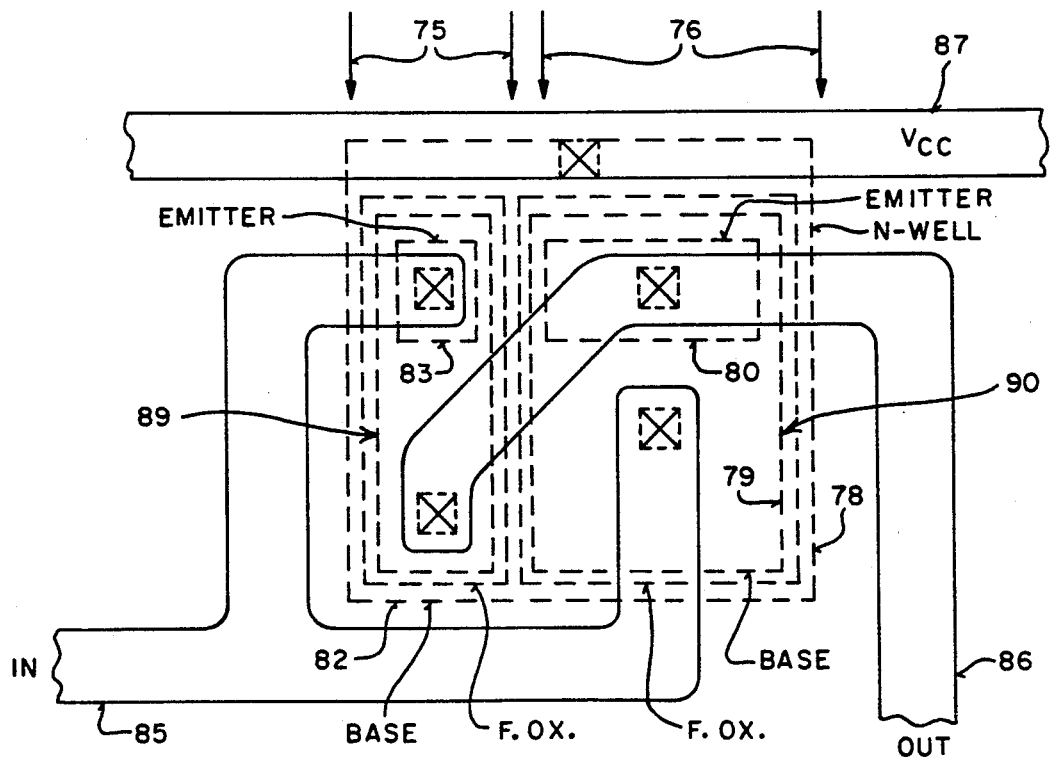

BASE-EMITTER REVERSE BIAS PROTECTION FOR BICMOS IC

BACKGROUND OF THE INVENTION

1. Field of the Invention

The invention relates to the field of bipolar transistors, particularly those used in conjunction with MOS transistors. More particularly, the invention relates to protecting the emitter-base junction against damaging reverse voltages.

2. Prior Art

The reverse biasing of the emitter-base junction in bipolar transistors which can result in current gain degradation, is a well recognized problem, particularly where the bipolar transistors are incorporated into MOS integrated circuits. The problem is aggravated when the speed of the bipolar transistor is raised by thinning-out the base region. The increased doping in the base region lowers the reverse breakdown potential of the emitter-base junction. This problem is discussed in "Bipolar Transistor Design for Low Process-Temperature 0.5 $\mu$m Bi-CMOS", *IEDM*-237, by M. Norishima, Y. Niitsu, G. Sasaki, H. Iwai and K. Maeguchi; and in, "Hot-Carrier Reliability of Bipolar Transistors", *IEEE 28th Annual Proceedings, Reliability Physics* 1990, by Burnett and Hu beginning at page 164.

One solution to this breakdown problem uses a reversed bias polysilicon diode across the emitter-base junction. While this is a satisfactory solution from an electrical standpoint, it often requires the use of an extra mask. In other instances, a bipolar junction transistor is used although this solution typically requires more substrate area. Additionally, MOS devices have been used to solve this problem. In some cases, the MOS devices do not provide sufficient protection.

As will be seen, the present invention uses an additional bipolar transistor formed in the same well as the bipolar transistor sought to be protected.

SUMMARY OF THE INVENTION

An improvement in a BiCMOS integrated circuit formed in a substrate in disclosed where first and second bipolar transistors are formed in a common well of a first conductivity type. A contact is made to the well providing a collector contact for both the first and second bipolar transistors. First and second spaced-apart regions of a second conductivity are formed in the well thereby defining a first and second base region for the first and second transistors, respectively. A third region of a first conductivity type is formed in the first region forming an emitter for the first transistor; similarly, a fourth region of the first conductivity type is formed in the second region forming an emitter region for the second transistor. First interconnection means are used for electrically connecting the first and fourth regions. Second interconnecting means are used for electrically connecting the second and third regions.

With this configuration, the second transistor conducts as the emitter-base junction of the first transistor becomes reversed biased, thereby preventing damage to the first transistor.

BRIEF DESCRIPTION OF THE DRAWINGS

FIG. 3 is a plan view showing one layout of the present invention.

FIG. 4 is a cross sectional elevation view of a substrate generally taken through sections lines 4—4 of FIG. 3.

FIG. 5 is a plan view illustrating a second alternate layout for the present invention.

FIG. 6 is a plan view illustrating a third alternate layout for the present invention.

FIG. 7 is a plan view illustrating the currently preferred layout of the present invention.

DETAILED DESCRIPTION OF THE PRESENT INVENTION

An improvement in a BiCMOS circuit is described for providing emitter-base protection for a bipolar transistor. In the following description, specific layouts and other specific details are described in order to provide a thorough understanding of the present invention. It will be obvious to one skilled in the art that the present invention may be practiced without these details. In other instances, well-known processing and fabrication techniques are not described in detail in order not to unnecessarily obscure the present invention.

In the following description the protection for a npn bipolar transistor is described. It will be obvious to one skilled in the art that the invention can be applied to a pnp bipolar transistor by reversing the conductivity types of the various regions described.

Figure 1A:
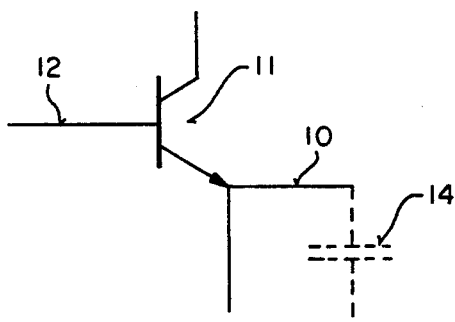
FIG. 1A is an electrical schematic showing a bipolar transistor with a capacitance load.
Figure 1B:
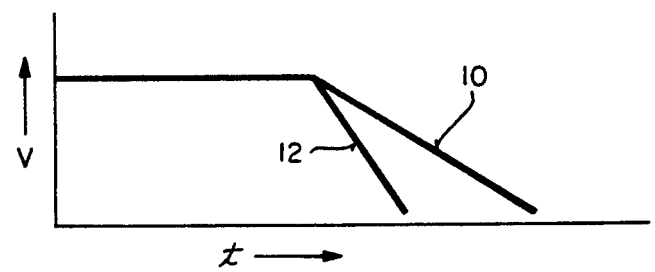
FIG. 1B is a graph showing the reverse biasing of the emitter-base junction that results when the output of the transistor of FIG. 1A transitions from high to low.

Before describing the present invention, the problem associated with bipolar transistors and the emitter-base reverse voltage can be quickly understood from reference to FIG. 1A. There, an npn transistor 11 is shown which receives an input driving signal on line 12. The output from the transistor 11 is the emitter terminal, line 10. A typical load includes some capacitance as is illustrated by the parasitic capacitance 14 of FIG. 1A. Assume, for purposes of discussion, that the potential on line 12 is such as to cause line 10 to be high so as to charge the capacitance 14. Assume now that the potential on line 12 is changed from high to low and the emitter output of transistor 11 changes from high to low. This is shown in FIG. 1B. The potential on line 12 can drop relatively quickly as shown in FIG. 1B when compared to the rate at which the potential on line 10 can drop because of the capacitance associated with that line. As the potential on line 12 drops more quickly than that on line 10, line 10 becomes negative relative to line 12 thereby reverse biasing the emitter-base junction of the transistor 11 to the extent that it can be damaged.

Figure 2A:
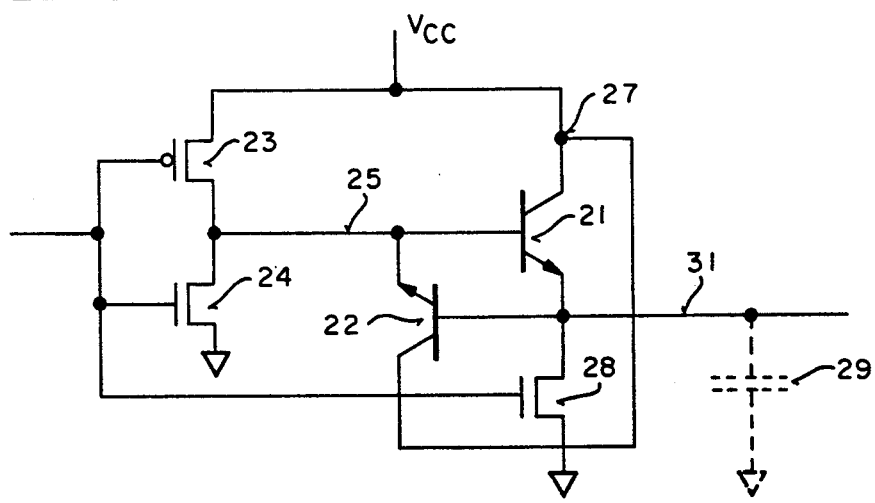
FIG. 2A is an electrical schematic showing the improved emitter-base protection of the present invention along with CMOS transistors used in conjunctions with the bipolar transistors.

The improvement of the present invention is shown in FIG. 2A. The npn transistor 21 is driving a load on line 31 through its emitter terminal under control of an input signal received on the transistor's base terminal, line 25. In a typical CMOS circuit, line 25 is driven by the p-channel transistor 23 and the n-channel transistor 24. In practice there can be other logic associated with this node. Additionally, an n-channel transistor 28 is used coupling line 31 to ground when line 25 is driven low. The improvement of the present invention comprises the use of the npn transistor 22 in a common well with the transistor 21 when connected as shown. Specifically, the collector terminal of the transistor 22 is common with the collector terminal of transistor 21 as shown by node 27. The emitter terminal of the npn transistor 22 is coupled to the base terminal of the transistor 21. The base terminal of the transistor 22 is coupled to the emitter terminal of the transistor 21.

Figure 2B:
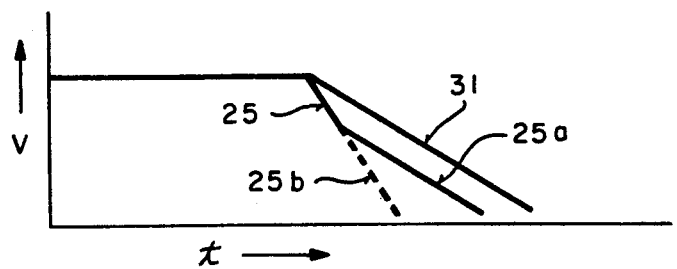
FIG. 2B is a graph used to describe the operation of the emitter-base reverse bias protection of the present invention.

Referring to FIG. 2B, again assume that the potential on line 31 is high since the input to the transistor 21, line 25, is high. Further assume that the potential on line 25 drops as shown in FIG. 2B and the potential on line 31 drops, albeit slower due to capacitance 29. But for transistor 22 the potential on line 25 would follow the path shown by line 25 and the dashed line 25b. However, because of transistor 22, once the potential between lines 25 and 31 reaches the predetermined potential required to cause transistor 22 to conduct, the potential on line 25 is prevented from dropping too quickly, and rather this potential follows the path shown by line 25a of FIG. 2B. When this clamping occurs, collector current is drawn from the collector of transistor 22. This prevents the emitter-base junction of the transistor 21 from being exposed to a reversed bias condition greater than that required to cause transistor 22 to conduct. This potential is approximately 1 to 1.5 volts and consequently, line 25a is approximately to 1 to 1.5 volts below line 31. This slight reverse biasing should not be large enough to damage transistor 21. Note transistor 22 only conducts with the onset of the reverse bias condition, otherwise it is off.

As mentioned both collectors for transistors 21 and 22 are formed in the same well. This, among other advantages, reduces the area required to form the transistor 22. When clamping occurs the current density is superior to an MOS device performing this function. The overall circuit performance is better than with an MOS device of size adequate for protection of transistor 21 against reverse bias. Moreover, as will be described, transistor 22 can be smaller than transistor 21 since its current need only be large enough to prevent the base of transistor 21 from discharging too rapidly.

Several different layouts of transistors 21 and 22 of FIG. 2A are shown in FIGS. 3, 5, 6 and 7. The currently preferred layout is shown in FIG. 7. The layout of FIG. 3 is shown in a cross sectional elevation view in FIG. 4. FIG. 3 was selected for the cross sectional elevation view since a cross section of this layout allows all the regions of both transistors to be viewed along with the intermediate field oxide regions. The steps used to fabricate the embodiments of FIGS. 3, 5, 6 and 7 are all the same, only the layout varies.

Referring to FIG. 3, two npn transistors are shown laid out within the n-well 33. Common collector contacts 37 to this n-well provides coupling to the collectors of both transistors. One transistor is generally identified with the arrow 41 and the other with the arrow 42. The base region of the transistor 41, as is illustrated, is generally wider than the base region of the transistor 42. As mentioned, transistor 42 need only be as large as necessary to supply sufficient current to the base of transistor 41 to prevent the emitter-base junction of transistor 41 from exceeding a critical damaging reverse bias which is greater than the on voltage of transistor 42 (1 to 1.5 volts). As can be seen from FIG. 3, the emitter regions for both transistors 41 and 42 are formed within their respective base regions.

More can be seen of the arrangement of FIG. 3 in the cross section elevation view of FIG. 4. First, the transistor 41 and 42 are formed on the substrate 32 as part of a BiCMOS integrated circuit. As will be appreciated, hundreds and perhaps thousands of the bipolar transistor pair shown in FIGS. 3 and 4 are formed on the substrate 32 along with perhaps a million or more CMOS transistors. The transistor pair of FIG. 3 is formed in a single n-well 33 which well is formed within the substrate 32. During "front end" processing as is commonly done, field oxide regions are locally formed using silicon nitride masking members. Each of the n-wells are isolated by a field oxidation region such as region 35 of FIG. 4. In the currently preferred embodiment, transistors 41 and 42 are separated by the field oxide region 40, which in fact encircle each of the transistors. Moreover, in the currently preferred embodiment, the collector region separates transistors 41 and 42 as well as the field oxide regions as shown by arrow 49. This tends to minimize collector resistance.

The transistor 41, which drives the load, includes a p-type base region 50 and an n-type emitter region 51 forming the emitter-base junction. The dopant for region 51 is diffused from a polysilicon member 52. The interface between region 50 and the well forms the collector-base junction. Similarly, the transistor 42 which provides the reverse bias protection for transistor 41 includes a p-type base region 46 and a n-type emitter region 47. The interface between these regions forms the emitter-base junction for transistor 42. Again, the dopant for the region 47 is driven into the substrate from the polysilicon member 48. The interface between region 46 and the well 33 forms the collector-base junction.

The specific processing used in the currently preferred embodiment to fabricate the transistor 41 and 42 and, in particular, to create a counter-doped collector is described in co-pending application Ser. No. 690,103; filed Apr. 23, 1991 and entitled "BiCMOS Process for Counter Doped Collector".

The exposed portions of the n-well are doped with an arsenic dopant forming region 38. This region allows the contact shown by line 37 of FIG. 4 to be made to the collector region of the transistors. In the currently preferred embodiment, region 38 is ion implanted with an arsenic dopant simultaneously with the formation of the source and drain regions of the n-channel transistors used in the integrated circuit. The p-type dopant of the base regions of transistors 41 and 42 is ion implanted simultaneously with the ion implanting of the source and drain regions of the p-channel transistors used in the integrated circuit. The polysilicon members 48 and 52 in the currently preferre embodiment are fabricated from a second level of polysilicon.

Overlying metal lines 44 are used to connect the member 48 (emitter region of transistor 42) to the base region 50 of transistor 41. Similarly, a metal interconnect 45 is used to connect the base region 46 of the transistor 42 to the polysilicon member 52 (emitter region 51) of the transistor 41. These metal lines, along with the accompanying contacts, are shown for the currently preferred embodiment in FIG. 7.

In the embodiment of FIG. 5, both bipolar transistors are shown being of the same size and again, both transistors 55 and 56 are formed within a common n-well 57. The base region 59 of transistor 55 includes within it the emitter region 60. Similarly, for the transistor 56, the base region 62 includes within it the emitter region 63. Note that for the layout of FIG. 5 the emitter regions are formed in a somewhat mirror image layout. The manner in which the emitters and bases are interconnected determines which transistor is providing the protection.

The embodiment of FIG. 6 includes the transistors 67 and 68 formed within the common n-well 65. A collector contact 66 is shown in FIG. 6. As was the case for the embodiment of FIG. 5, both transistors are shown being of the same size in FIG. 6. For transistor 67 the emitter region 70 is formed within base region 69 and similarly, for the transistor 68, the emitter region 74 is formed within the base region 73.

The currently preferred embodiment, as shown in FIG. 7, is similar to the embodiment of FIG. 6 with the distinction that the transistor 89 is substantially smaller than the transistor 90. Transistor 89 corresponds to the transistor 22 of FIG. 2A while the transistor 90 of FIG. 7 corresponds to transistor 21 of FIG. 2A. Both transistors 89 and 90 of FIG. 7 share the n-well shown by the dashed line 78. For the transistor 90, the base region is outlined by dashed line 79 and within this base region, the emitter region is outlined by the dashed line 80. For the transistor 89, its base region is shown by the dashed line 82, and it emitter region by the dashed line 83. in a typical integrated circuit, the ratio of the widths shown by arrows 75 and 76 can vary from 3 to 15, with the transistor providing the protection being smaller. There are cases where the transistors are the same size such as in a NOR gate where, by way of example, few inputs can switch high at the same time.

One metal line 85 connects both the emitter region of transistor 89 and the base region of transistor 90. This line is identified with the word "in" and corresponds to line 25 of FIG. 2A. The metal line 86 connects the emitter region of transistor 90 with the base region of transistor 89. This line is marked with "out" to indicate circuit output. The "X"s shown within the metal lines signifies a contact from the metal line to the underlying regions of the transistors. The metal line 87 is connected by a contact to the n-well (collector) of the transistors. This line carries the positive potential for the circuit.

The other transistors shown in FIG. 2A are not shown in FIG. 7 they can be formed in separate wells from the well 78 of FIG. 7.

Thus, a circuit has been described which provides emitter-base protection for a bipolar transistor, particularly one formed as part of a BiCMOS integrated circuit.

I claim:

1. A circuit for a BiCMOS integrated circuit formed on a substrate comprising:
    a well of a first conductivity type formed in said substrate;
    a contact to said well forming a collector contact for a first and a second bipolar transistor;
    a first and a second spaced-apart region of a second conductivity type formed in said well, thereby defining a first and a second base region for said first and second transistors, respectively;
    a third region of said first conductivity type formed in said first region forming an emitter region for said transistor;
    a fourth region of said first conductivity type formed in said second region forming an emitter region for said second transistor;
    first connection means for electrically connecting said first and fourth regions;
    second connection means for electrically connecting said second and third regions such that a reverse bias potential between said emitter and said base regions of said first transistor is prevented from becoming greater than the potential required for said second transistor to conduct.

2. The circuit defined by claim 1 wherein said first conductivity type is n-type.

3. The circuit defined by claim 2 wherein said first region is larger in area than said second region.

4. The circuit defined by claim 3 wherein a field oxide region is disposed between said first and second regions.

5. The circuit defined by claim 1 wherein said well is ion implanted and wherein said ion implantation incident on the space between said spaced-apart first and second regions.

6. In a BiCMOS integrated circuit having a bipolar transistor formed in a well of a first conductivity type where said well forms a collector region for said bipolar transistor, an improvement for preventing reverse voltage damage between the emitter-base junction of said transistor comprising:
    a first region of a second conductivity type formed in said well so as to form a first junction between said well and said first region, said first region being electrically connected to said emitter region of said transistor; and,
    a second region of said first conductivity type formed in said first region so as to form a second junction between said first and second region, said second region being electrically connected to said base region of said transistor so as to maintain said second junction and said emitter-base junction of said transistor at an equal potential.

7. The improvement defined by claim 6 wherein said first conductivity type is n-type.

8. An integrated circuit formed on a substrate comprising:
    an n-type well formed in said substrate;
    a first and a second p-type base region separated from one another formed in said well;
    a first n-type emitter region formed in said first p-type base region;
    a second n-type emitter region formed in said second p-type base region;
    said first p-type base region being connected to said second n-type emitter region so as to maintain said first p-type base region and said second n-type emitter region at an equal potential;
    said second p-type base region being connected to said first n-type emitter region so as to maintain said second p-type base region and said first n-type emitter region at an equal potential.

9. In a BiCMOS circuit having a bipolar transistor formed in a well of a first conductivity type, a method for preventing emitter-base reverse bias damage to said transistor comprising the steps of:
    forming a first of a second conductivity type in said well;
    forming a second region of said first conductivity type in said first region;
    connecting said first region to the emitter region of said bipolar transistor;
    connecting said second region to the base region of said bipolar transistor; and,
    maintaining an equal potential across said emitter-base of said transistor and across said first region and second region.

* * * * *

UNITED STATES PATENT AND TRADEMARK OFFICE
CERTIFICATE OF CORRECTION

PATENT NO. : 5,227,657
DATED : July 13, 1993
INVENTOR(S) : Martin S. Denham

It is certified that error appears in the above-indentified patent and that said Letters Patent is hereby corrected as shown below:

Col. 5, Line 27    Delete "it" and insert--its--

Col. 5, Line 27    Delete "in" and insert--In--

Col. 6, Line 16    After implantation insert--is--

Col. 6, Line 32    Delete "region" and insert--regions--

Signed and Sealed this

Twenty-seventh Day of December, 1994

Attest:

BRUCE LEHMAN

Attesting Officer        Commissioner of Patents and Trademarks